United States Patent
Mahawili

[19]
[11] Patent Number: 5,951,896
[45] Date of Patent: Sep. 14, 1999

[54] RAPID THERMAL PROCESSING HEATER TECHNOLOGY AND METHOD OF USE

[75] Inventor: Imad Mahawili, Grand Rapids, Mich.

[73] Assignee: Micro C Technologies, Inc., Kentwood, Mich.

[21] Appl. No.: 08/759,559

[22] Filed: Dec. 4, 1996

[51] Int. Cl.[6] .............................. A21B 1/00; F26B 3/30
[52] U.S. Cl. ..................... 219/411; 219/405; 219/409; 392/411; 392/418
[58] Field of Search ................................ 219/405, 411, 219/413, 390; 392/416, 418, 419, 422, 423, 424, 427; 118/724, 725; 362/363, 186, 171, 224, 223

[56] References Cited

U.S. PATENT DOCUMENTS

| | | | |
|---|---|---|---|
| 3,626,154 | 12/1971 | Reed | 219/405 |
| 3,836,751 | 9/1974 | Anderson | 219/405 |
| 4,550,684 | 11/1985 | Mahawili | 118/724 |
| 4,592,307 | 6/1986 | Jolly | 118/719 |
| 4,680,447 | 7/1987 | Mahawili | 219/343 |
| 4,680,451 | 7/1987 | Gat | 219/411 |
| 4,748,135 | 5/1988 | Frijlink | 437/102 |
| 4,834,022 | 5/1989 | Mahawili | 118/725 |
| 4,993,358 | 2/1991 | Mahawili | 118/715 |
| 5,049,726 | 9/1991 | Higgins et al. | 219/464 |
| 5,155,336 | 10/1992 | Gronet et al. | 219/411 |
| 5,317,492 | 5/1994 | Gronet et al. | 362/294 |
| 5,382,805 | 1/1995 | Fannon et al. | 250/504 |
| 5,446,825 | 8/1995 | Moslehi | 392/413 |
| 5,453,124 | 9/1995 | Moslehi et al. | 118/715 |
| 5,487,127 | 1/1996 | Gronet et al. | 392/416 |
| 5,525,160 | 6/1996 | Tanaka | 118/728 |
| 5,551,985 | 9/1996 | Brors | 392/418 |
| 5,603,772 | 2/1997 | Ide | 219/411 |

FOREIGN PATENT DOCUMENTS

| | | |
|---|---|---|
| 3908600 | 9/1990 | Germany . |
| 664058 | 1/1988 | Switzerland . |
| 1544551 | 4/1979 | United Kingdom . |

*Primary Examiner*—Teresa Walberg
*Assistant Examiner*—Thor Campbell
*Attorney, Agent, or Firm*—Van Dyke, Gardner, Linn & Burkhart, LLP

[57] ABSTRACT

A heating assembly for heating semiconductor substrates includes a plurality of heating devices, with each heating device including an energy emitting filament adapted for electrically coupling to an external power supply and housed in a first enclosure. The first enclosure comprises energy transmitting material so that energy generated by the filament will be transmitted through the enclosure. A second enclosure houses the first enclosure, which also comprises energy transmitting material. The second enclosure is coated with a reflective layer and is housed in a third enclosure of transmitting material, which encapsulates the reflective coating so that when the energy emitting filament is energized, the reflective coating is contained in the heating device. A heating assembly includes a frame having a plurality of supports for supporting a plurality of the heating devices. The heating devices are arranged in at least two heating zones, a first of the heating zones for heating a peripheral region of the semiconductor substrate and a second of the heating zones heating central regions of the semiconductor substrate. A first group of heating devices forming the first heating zone are spaced a first distance from the substrate. A second group of heating devices forming the second heating zone are spaced a second distance from the substrate wherein the first distance is less than the second distance so that more energy is directed to the peripheral regions of the substrate that the central regions.

52 Claims, 4 Drawing Sheets

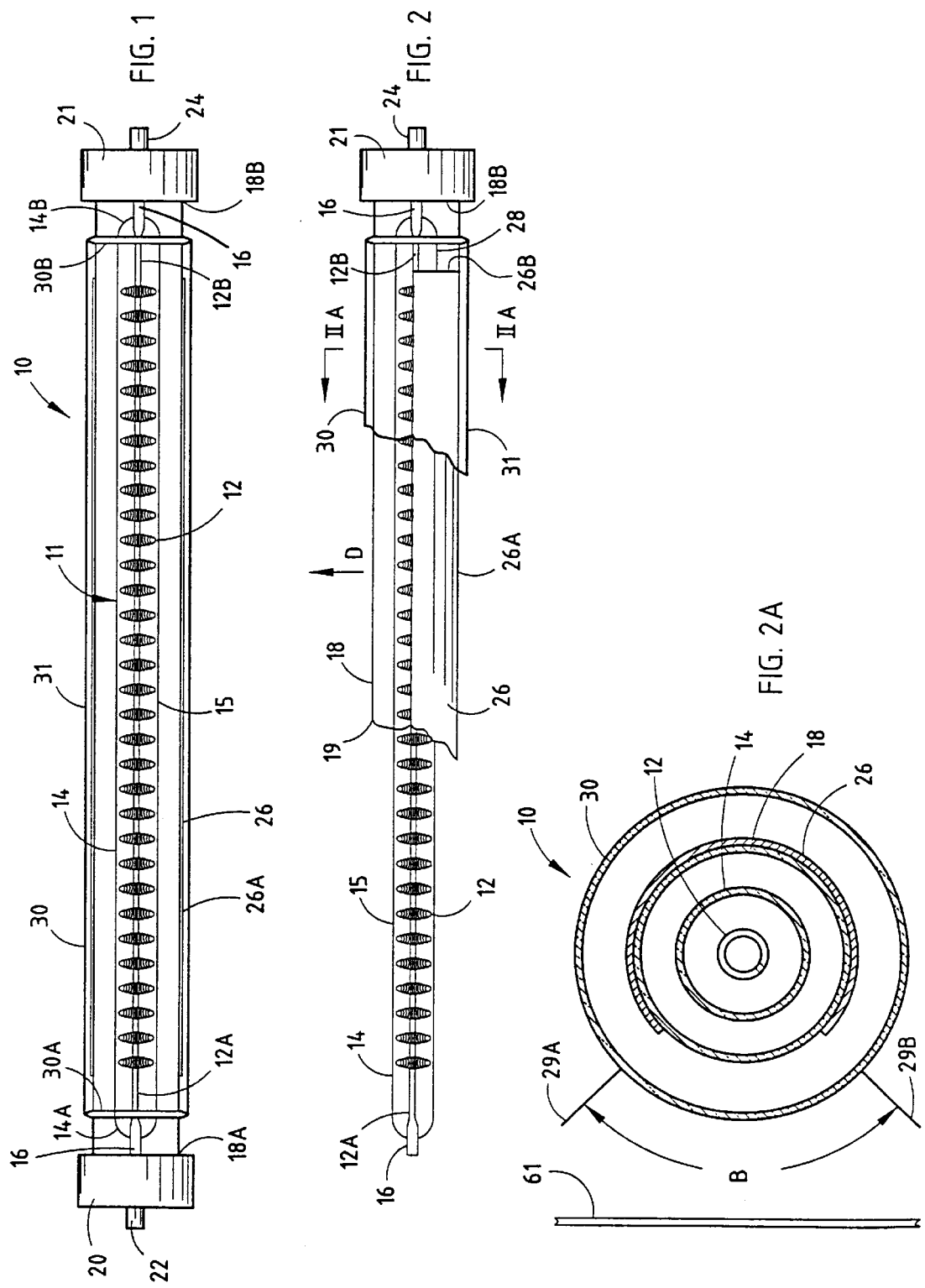

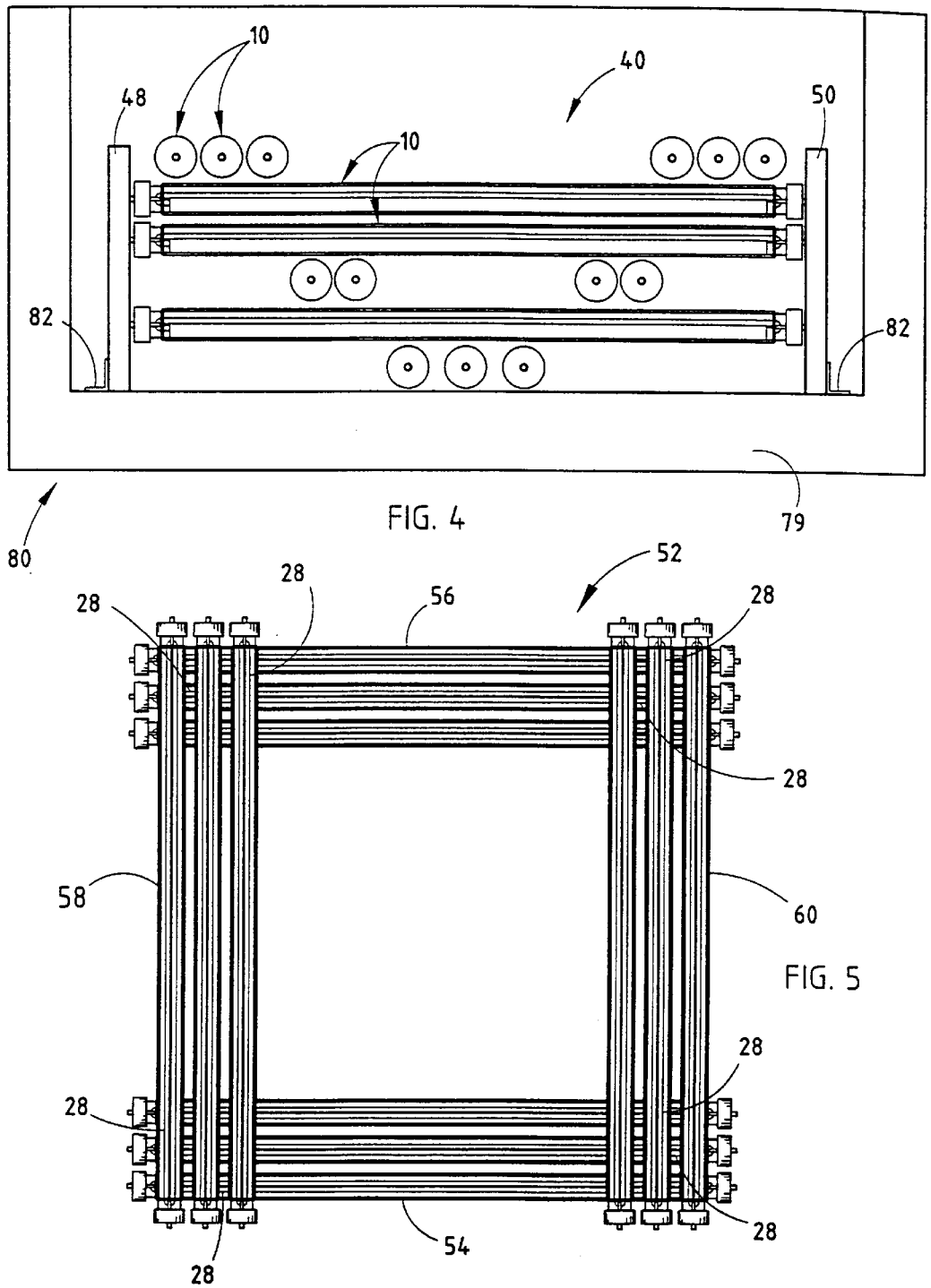

RAPID THERMAL PROCESSING HEATER TECHNOLOGY AND METHOD OF USE

BACKGROUND AND TECHNICAL FIELD OF THE INVENTION

The present invention relates to a rapid thermal heating apparatus for heating substrates and, more particularly, to a heating apparatus for heating semiconductor substrates, including, for example, silicon wafers.

In semiconductor fabrication, a semiconductor substrate is heated during various temperature activated processes, for example, during film deposition, oxide growth, and etching.

When heating the substrate, it is desirable to heat the substrate uniformly—in other words, heat the substrate so that all the regions of the substrate are heated to the same temperature. This temperature uniformity in the substrate provides uniform process variables on the substrate. For instance in film deposition, if the temperature in one region of the substrate varies from another region, the thickness of the deposition in these regions may not be equal. Moreover, the adhesion of the deposition to the substrate may vary as well. Furthermore, if the temperature in one region of the substrate is higher or lower than the temperature in another region of the substrate, a temperature gradient within the substrate material is formed. This temperature gradient produces thermal moments in the substrate, which in turn induce radial local thermal stresses in the substrate. These local thermal stresses can reduce the substrate's strength and, furthermore, damage the substrate.

Conventional methods of heating a semiconductor substrate include indirect heating and heating direct methods. Indirect heating methods use resistive wire elements to heat the substrate. The resistive wires are typically adhered to or imbedded into a platform that supports the substrate. When the resistive elements are coupled to a power source and supplied with electrical current, the resistive elements heat the platform, which in turn heats the substrate. However, the amount of heat that the platform can deliver to the substrate is limited by the thermal diffusivity of the platform material. Furthermore, the heat-up rate of the substrate is limited to a temperature that will preserve the integrity of the adhesion of the resistive element to the platform material. This temperature typically does not provide the heat-up rate that is desired in semiconductor fabrication in which a rapid heat-up rate is preferred to minimize the total substrate processing heating budget.

Direct heating methods include the use of infrared lamps. Infrared lamps generally provide for a rapid heat-up rate and also achieve high substrate temperatures without any direct contact of the substrate. The drawbacks to the infrared heating technologies have been the lack of control of the temperature uniformity in the substrate and the significant power loss that occurs due to the fact that infrared lamps are cylindrical radiators. In a conventional direct heating apparatus, a semiconductor substrate, such as a semiconductor wafer, is disposed in a chamber and heated by radiation from a plurality of infrared linear lamps, for example T3 lamps commercially available from GTE Sylvania, which are approximately eight to twelve inches long. These lamps are known in the industry as Tungsten-Halogen lamps because their resistive lamp element is made of tungsten and the gas that fills the quartz lamp tube contains a concentration of a complex halogen gas mixture. These lamps typically emit a gray body type of spectral emission and, at full voltage, can peak at about 0.95 micron light wavelength—a wavelength that is almost totally absorbed by silicon.

The linear lamps produce a "flood" type rapid thermal heating process. Heretofore these "flood" type heating processes have not provided adequate control of the temperature profile in the substrate because the different regions of the substrate typically have different energy absorption or emissivity characteristics. In general, the regions close to the substrate's perimeter cool faster than the central regions of the substrate. For example, if a "flood" heating source is used to heat a semiconductor substrate during a rapid thermal processing cycle in which the thermally isolated substrate may be ramped to a temperature on the order of 10° to 300° C./sec., the peripheral regions of the substrate will maintain a different temperature than the central regions because the peripheral regions can accept radiant energy from a wider field of view and emit radiant energy to wider field of view. When constant uniform power is used to heat a substrate, the peripheral portions will be cooler than the central portions of the substrate during the ramp-up and cool-down portions of the heating cycle. As described above, these temperature gradients in the semiconductor substrate induce radial thermal stresses in the semiconductor substrate. These radial thermal stresses are generally not acceptable in many processes, especially in high temperature processes in which the crystalline integrity of the semiconductor substrate can be substantially compromised. Temperature differentials between the center and the edge as small as 5° C. can induce warpage, defect generation, and crystal slip in the substrate. Although a bank of lamps have been used and modified to compensate for center to edge temperature differences during either the ramp-up or ramp-down phases of the heating cycles by using reflectors or shades, these configurations have not succeeded in providing the temperature uniformity that is preferred in these various temperature processes for semiconductor substrates.

Other types of T3 type lamps have also been used. These tend to be of the shorter variety, typically in the two to five inches in length and which usually have screw in type connectors. These lamps are usually inserted in a highly reflective base, such as in a flashlight reflector, but generally require a cooling system. Such heating systems offer an advantage to linear lamps since they can be arranged into a number of radial arrays with varying power inputs and, thus, provide better control of the substrate temperature uniformity. In general, applications using the shorter T3 type lamps usually require higher power densities per lamp and a higher number of lamps to effect the same power input. As a result, they tend to be less efficient heating systems.

The current technical evolution of these methods has focused on the development of reflector technologies that have been of complex reflectivity designs, which have been complicated by the need to cool the reflectors. For example in U.S. Pat. No. 5,487,127 to Gronet et al., a plurality of these shorter lamps are housed in light pipes that are inserted in a water-cooled quartz window assembly. The light pipes are independently controlled heat sources, each providing energy to a predetermined area of the substrate or wafer. Sensors for sensing the temperature of the area of the substrate heated by the heating apparatus provide feedback to control of the heat sources to maintain uniform temperature across the substrate. While the Gronet heating apparatus provides a more uniform application of heat energy to the substrate, the apparatus is generally less efficient because of the wasted heat energy and is more complicated, requiring sophisticated control circuitry.

SUMMARY OF THE INVENTION

One aspect of the invention provides an improved heating device that directs a high degree of its emitted energy toward a desired target, yet is useable in environments that are highly sensitive to atomic migration of metals that have previously been used in the reflectors of some infrared emitters. The heating device includes an energy emitting filament housed in an inner enclosure formed of energy transmitting material. An intermediate enclosure, also of energy transmitting material, houses the inner enclosure. One side of the intermediate housing is coated with a reflective material, and preferably gold, so as to leave an uncoated region forming a window through which the energy generated by the filament can escape. An outer enclosure, again of energy transmitting material, houses the intermediate enclosure and encapsulates the reflective coating so that when the energy emitting filament is energized, particles of the reflective coating are contained in the heating device. In this manner, the heating device has wide application in environments in which migrating metal particles may be detrimental. The heating device is particularly suitable for use in a semiconductor fabrication environment where strict control of foreign particles in the vicinity of the semiconductor substrate must be maintained, since semiconductor substrates are particularly susceptible to migrating metal particles.

In a preferred aspect, the reflective coating includes a circumferential extent extending around the intermediate enclosure through a preferred range of about two hundred and twenty degrees to three hundred and thirty degrees so that a heat emitting window is formed on the uncoated side of the intermediate enclosure, which permits the energy to escape and to project onto the target with an angle of focus in a range between about one hundred and twenty degrees and thirty degrees, respectively.

In another preferred aspect of the present invention, the heating device is generally cylindrical with an inner cylindrical tubular member housing an energy emitting filament and an intermediate cylindrical tubular member having a cylindrical wall extending between the ends of the intermediate cylindrical tubular member. A reflective coating extends around a portion of the cylindrical wall for reflecting the energy emitted from the filament toward a target. An outer cylindrical member extends over the reflective layer and is welded to the cylindrical wall of the intermediate cylindrical member to encapsulate the reflective layer in the heating device. In other aspects, the filament includes a hot energy emitting central zone bounded by cold end zones. The reflective coating is disposed on one side of the intermediate cylindrical tubular member and extends over the hot zone of the filament, but terminates at or near the cold zones of the filament. This reduces the amount of reflective material and thus the cost of the device. In devices which use a highly expensive coating material, such as gold, these savings can be significant.

In a further aspect of the invention, a heating assembly includes an array of heating elements that are layered to form a plurality of heating zones, which provide a concentrated heating profile with a greater amount of heating being applied to the outer perimeter than the center of the desired target area. Preferably, the layered heating assembly accomplishes this by positioning one layer of heating elements overlaying the outer perimeter closer to the target area than another layer of heating elements that overlay the center of the desired target area. Additionally or alternatively, a greater number of heating elements may be positioned over the outer perimeter of the target area than are positioned over the center. Most preferably, at least three layers of heating elements are assembled over the target area and are spaced progressively further from the target area so that an intermediate layer, which heats an intermediate region of the target area is closer to the target area than the layer heating the center but further from the target than the layer heating the outer perimeter.

In another aspect of the invention, a method of heating a semiconductor substrate includes heating the substrate with the heating device described herein.

In yet another aspect of the method of the invention, a semiconductor substrate is heated by spacing layers of heating elements over the semiconductor substrate, each layer of heating elements being progressively spaced further away from the semiconductor substrate.

As will be understood, the heating device of the present invention provides numerous advantages over prior known heating devices. The heating device eliminates the need for complex and water-cooled reflectors. Moreover, this outer enclosure hermetically seals the gold plating material. This enables the use of the gold plated linear lamp within a semiconductor processing environment while taking full advantage of the high incidence of forward projection of the heating device energy, but without the risk of contamination. With the heating assembly of the present invention, a plurality of heating elements are arranged so that the received energy from the heating elements varies across the semiconductor substrate to accomodate the varying diffusivity and emissivity of the semiconductor substrate. This results in the temperature profile in the substrate being maintained relatively uniform, and hence, reduces the stresses and temperature moments which may otherwise result.

These and other objects, advantages, purposes and features of the invention will be apparent to one skilled in the art from a study of the following description taken in conjunction with the drawings.

DESCRIPTION OF THE DRAWINGS

FIG. 1 is a top view of a heating device of the present invention;

FIG. 2 is a partial cut-away side elevational view of the heating device of FIG. 1;

FIG. 2A is a cross-sectional view of the heating device taken along line IIA—IIA of FIG. 2 shown directed toward a target;

FIG. 4 is a side elevational view of heater assembly position in a heating chamber;

FIG. 5 is a top plan view of a first zone of the three dimensional heater assembly;

THE DESCRIPTION OF THE PREFERRED EMBODIMENTS

Figure 3:
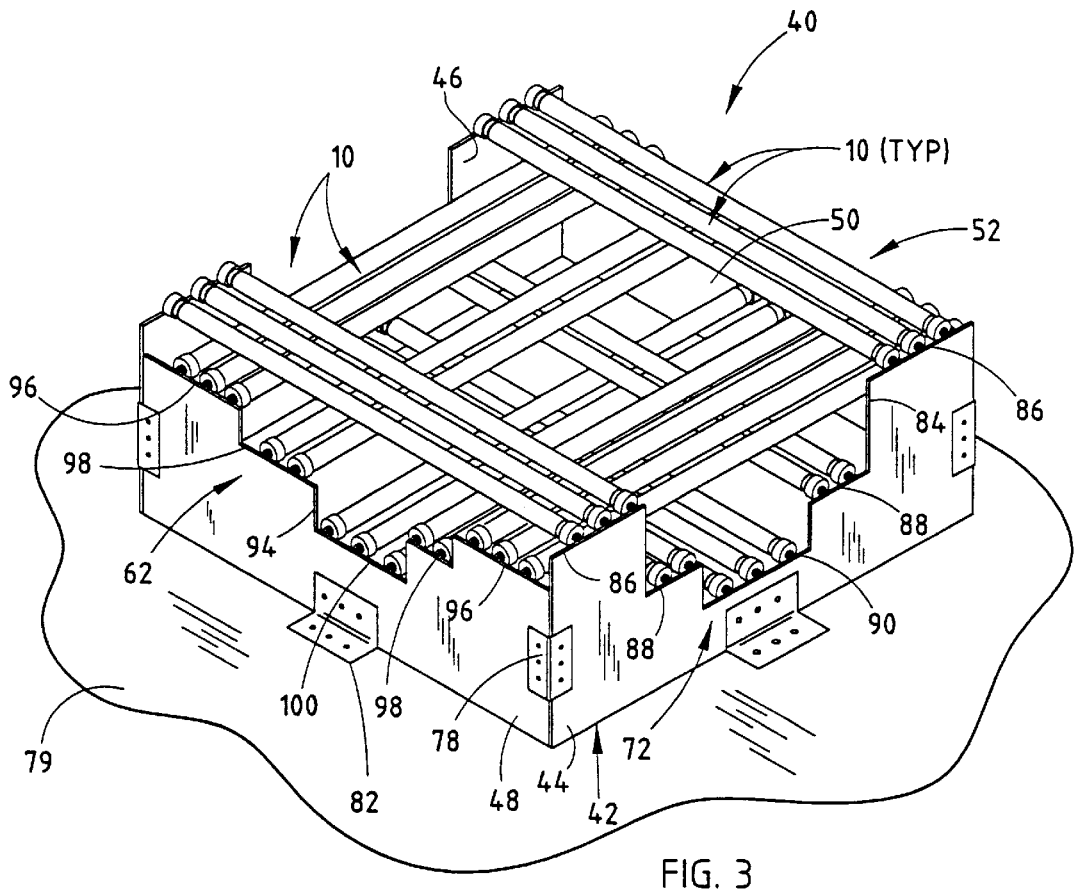
FIG. 3 is a perspective view of a three dimensional heater assembly of the present invention having a plurality of the heating devices in FIG. 1.

The present invention is embodied in a heater device shown in preferred form in FIG. 1 and referenced generally by the numeral 10. Heater element 10 includes an energy emitting filament 12 enclosed in three coaxial housings 14, 18 and 30, all of which permit the transmission of energy from filament 12. At least one side on intermediate housing 18 is coated with a reflective agent in order to direct and concentrate the emitted energy from filament 12, and outer housing 30 encapsulates the reflective coating to avoid particulate dispersion of the reflective matter. The preferred-heater assembly of the present invention is shown in FIG. 3 and referenced by numeral 40. Heater assembly 40 includes three spaced layers of heating elements, with a layer 52 that is spaced closest the target area being disposed about the outer perimeter, the next furthest spaced layer 62 disposed in an intermediate region, and the furthest spaced layer 72 disposed in the center. Heater assembly 40 provides a generally uniform heating profile to certain objects, such as in particular, semiconductor materials.

Referring again to FIG. 1, heating device 10 includes a linear lamp 11, for example a T3 Tungsten-Halogen lamp specified at one kilowatt at 120 voltage alternating current (VAC), which is commercially available from GTE Sylvania or other lamp manufacturers. Lamp 11 generally comprises energy emitting filament 12 and an elongated tubular element 14 of transparent energy transmitting material that houses and encloses filament 12. Elongated tubular element 14 may comprise any energy transmitting material that transmits energy corresponding to the wavelength of filament 12. Wire filament 12 preferably comprises an infrared energy emitting filament. More preferably, wire filament 12 is a short wave emitter having a wavelength of about 0.9 to 2.3 microns; therefore, elongated tubular element 14 preferably comprises a quartz, silica, or sapphire material. Most preferably, wire filament 12 is an incandescent helically coiled tungsten wire filament. In the illustrated embodiment, elongated tubular member 14 comprises a cylindrical tube having a cylindrical wall 15 extending between two closed ends 14A and 14B. Filament 12 is coaxial with tubular element 14, extending along the longitudinal extent of the elongated element 14, and is supported in tubular element 14 on ends 14A and 14B. Filament 12 is spaced apart from cylindrical wall 15 of tubular element 14 and coupled by connectors, for example tungsten wire connectors, to electrodes 16 on its ends 12A and 12B, which project exteriorly of ends 14A and 14B for electrically coupling filament 12 to a power supply (not shown).

As best seen in FIG. 2, tubular element 14 is housed in a second tubular element 18. Second tubular element 18 is also formed from energy transmitting material and, preferably, comprises a quartz, silica, or sapphire cylindrical tube. Second tubular element 18 includes a cylindrical wall 19 that extends between first and second open ends 18A and 18B, which are capped with two sealed insulating end caps 20 and 21. End caps 20 and 21 may comprise alumina, mica, or any other suitable insulating material. Preferably, end caps 20 and 21 are sealed and retained on ends 18A and 18B of second tubular element 18 with an insulating paste or glue, for example alumina paste. In order to supply power to filament 12, end caps 20 and 21 include electrodes 22 and 24, which project outwardly from end caps 20 and 21 on one end for coupling to the external power supply and couple on their other ends to electrodes 16, which extend exteriorly of tubular element 14.

Referring to FIG. 2, a thin coat of reflective material 26, such as gold, is deposited on the outside of one side of second tubular member 18. The reflective material 26 thereby defines a non-heating emitting surface on one side of second tubular member 18 and a heat emitting surface side on the other side of second tubular member 18. Coating 26 includes a longitudinal extent 26a that extends along the longitudinal axis of second tubular members 18 and a circumferential extent 26b that preferably extends at least approximately half way around the circumference of second tubular element 18. In this manner, a window is provided on the uncoated side of second tubular member 18 through which energy from the filament 12 is emitted and projected at an angle of focus denoted by β in FIG. 2A. Preferably, the heat emitting surface has an angle of focus in the range of thirty degrees to one hundred and twenty degrees. Most preferably, angle of focus β is about ninety degrees. But it should be understood that angle of focus β can be varied from one degree up to just slightly less than three hundred and sixty degrees depending on the particular application. The longitudinal extent 26a of coating 26 extends over the hot zone of the filament and, preferably, terminates before the cold zones 28 of the tungsten wire connectors to minimize the amount of reflective material, which in the case of gold is expensive, while maximizing the amount of energy that is emitted and, therefore, the efficiency of the heating device 10.

In this manner, when filament 12 is energized by the external power source, a substantial majority of the emitted energy is projected from heating device 10 in a focused pattern that is generally orthogonal to the cylindrical walls of the tubular elements 14, 16, and 18 and is bounded by leading edges 29a and 29b as shown in FIG. 2A with its center located at the center of the tungsten filament 12. Lamps encapsulated in a gold plated tubular element, similar to lamp 11 and tubular element 18 but excluding the outermost tubular element described herein, are available from John J. Fannon Co. Inc. and described in more detail in U.S. Pat. No. 5,382,805 to Fannon et al., which is incorporated herein by reference in its entirety. The Fannon lamp is typically used in the automobile paint drying industry where a number of these Fannon lamps are stacked in an array, with the uncoated sides of the lamps facing the parts to be dried.

An outer tubular element 30 of energy transmitting material houses at least a portion of second tubular element 18 and extends over the longitudinal extent 26a of the reflective coating 26. Outer tubular element 30 preferably comprises a quartz, silica, or sapphire cylindrical tube and includes a cylindrical wall 31 extending between two open ends 30A and 30B. Outer tubular element 30 is evacuated and preferably heat welded to the cylindrical wall 19 of second tubular element 18 to seal outer tubular element 30 on second tubular member 18. It should be understood that outer tubular element 30 may also extend over the full longitudinal extent of the second tubular element 18 and may be evacuated and heat welded to a pair of end caps (not shown) to seal second tubular element 18 therein. Furthermore, these end caps may be of similar construction to end caps 20 and 21 and comprise an insulating material, such as alumina, mica, or any other suitable insulating material. Alternatively, these end caps may be sealed and retained on open ends 30A and 30B of outer tubular element 30 with an insulating paste or glue, for example alumina paste. In order to supply power to filament 12, each of these end caps includes an electrode (not shown), which projects outwardly from the respective end cap on one end for coupling to the external power supply and couple on its other end to the respective electrode (22 or 24) of end cap 20 or 21. In all of these embodiments, outer welded tubular element 30 hermetically seals the reflective material (26) and, thus, enables the use of lamp 11 within a semiconductor manufacturing environment while taking full advantage of the forward projection of the lamp's energy without the need for complex and water-cooled reflectors. Furthermore, the hermetically sealed reflective material isolates the reflective material from the processing chamber to prevent the possibility of the particles comprising the reflective material from transporting from the heating device to the semiconductor substrate. This is of particular concern with gold because of the high atomic mobility of gold into semiconductor substrates, such as silicon.

Referring to FIGS. 3, a heater assembly 40 includes a plurality of heating elements supported in a frame 42 having four sides 44, 46, 48, and 50. Preferably each of the heating elements comprises heating device 10 having a one kilowatt lamp 11, as described above. Heating devices 10 are positioned in frame 42 to orient their uncoated, heat emitting sides toward a target, for example a semiconductor substrate. As best seen in FIG. 5, a first heating zone 52 includes twelve heating devices 10. Preferably, the twelve heating devices 10 are arranged in a square frame-shaped arrangement having front and back sides 54 and 56 and left and right sides 58 and 60, with three heating devices 10 arranged on each side 54, 56, 58, and 60 in an overlapping arrangement. The use of the terms "front" and "back" and "left" and "right" are used for reference purposes and are, therefore, illustrative only. Preferably, the cold zones 28 of heating devices 10 on sides 58 and 60 overlap cold zones 28 of heating devices 10 on sides 54 and 56 in order to maximize the energy of each heating device 10 that is directed toward the substrate and to leave the energy emitting region of filament 12 unobstructed by adjacent heating devices 10. First heating zone 52 of heater assembly 40 includes heating devices 10 for the peripheral, outermost area of a semiconductor substrate 61 (shown in phantom). Heating devices 10 of heating zone 52 can be configured either as a single control zone, wherein all the heating devices 10 are connected to one controller or may be connected to form two or more control zones. For example, if the twelve heating devices 10 of first heating zone 52 are configured as two control zones, then the first control zone may include the groups of three heating devices 10 positioned on sides 58 and 60, with the other groups of three heating devices 10 on sides 54 and 56 providing a second control zone.

Figure 6:
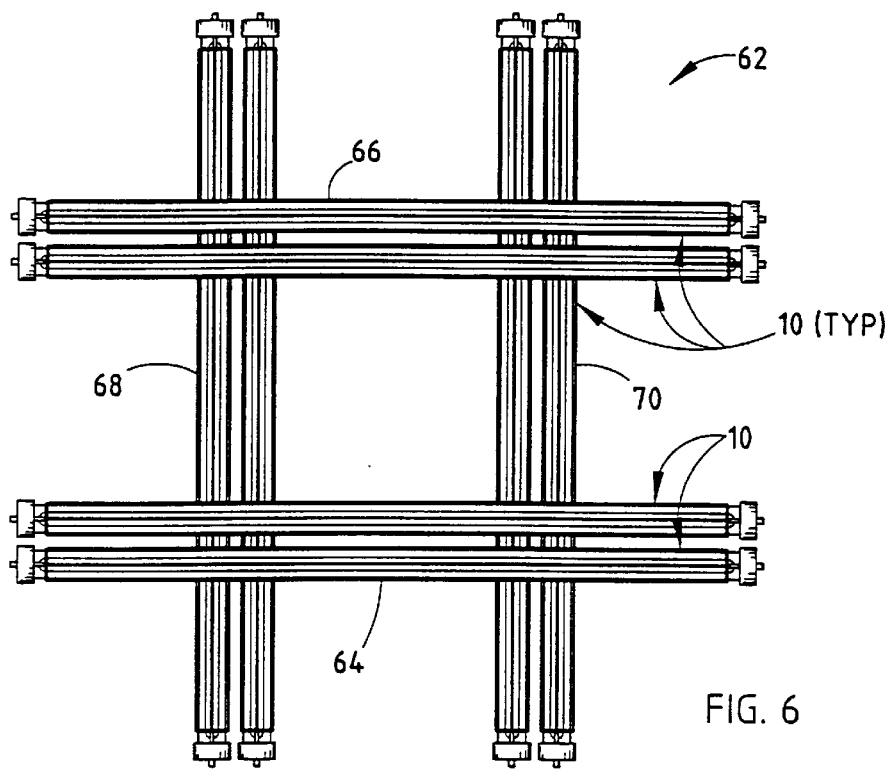
FIG. 6 is a top plan view of a second zone of the three dimensional heater assembly.

Referring now to FIG. 6, a second heating zone 62 includes eight heating devices 10. Preferably, the eight heating devices 10 are arranged in a lattice-shaped arrangement having front and back sides 64 and 66 and left and right sides 68 and 70, with two heating devices 10 arranged on each side 64, 66, 68, and 70 in an overlapping arrangement. Again, the use of the terms "front" and "back" and "left" and "right" are used for reference purposes and are, therefore, illustrative only. As will be understood in reference to FIG. 3, the cold zones of the eight heating devices 10 extend under portions of the heating devices 10 of first heating zone 52 so that the energy from heating devices 10 in heating zone 62 is not obstructed by heating devices 10 in first heating zone 52. Furthermore, the overlapping arrangement of heating devices 10 in heating zone 62 is such that only a relatively small amount of energy of the heating devices on sides 68 and 70 is reflected back. Second heating zone 62 provides heater devices 10 for intermediate portions of semiconductor substrate 61, which requires less heat than the peripheral portions of the substrate 61. Where the eight heating devices 10 of first heating zone 62 are configured as two control zones, then the first control zone may include the group of two heating devices 10 positioned on sides 64 and 66, with the other groups of two heating devices 10 on sides 60 and 62 providing a second control zone.

Figure 7:
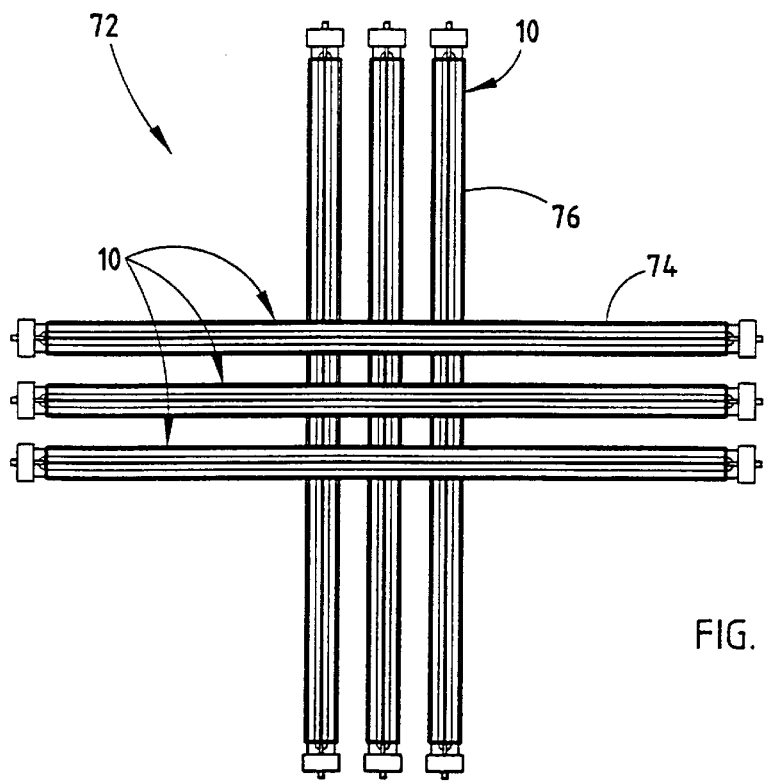
FIG. 7 is a top plan view of a third zone of the three dimensional heater assembly.

A third heating zone 72 is illustrated in FIG. 7. Third heating zone 72 includes six heating devices 10 that are arranged in a cross-shaped configuration, with a first group 74 of three heating devices 10 arranged in an orthogonal relationship to a second group 76 of three heating devices 10 in an overlapping relationship. Similarly to second heating zone 62, the cold zones of each of heating devices 10 extend under heating devices 10 of the first heating zone 52 so that the energy from heating devices 10 in heating zone 72 is not obstructed by heating devices 10 in first heating zone 52. Again, only a relatively small amount of energy is reflected back as a result of the overlapping arrangement of the first group 74 of heating devices 10 with the second group 76 of heating devices 10 and of the overlapping arrangement of the heating devices 10 in second and third heating zones 62 and 72. Third heating zone 72 is provided to heat and control the temperature of the central parts of substrate 61. This zone can also be divided up into two control zones, with each control zone including one of the groups of three heating devices 10.

In the illustrated embodiment twenty-six heating devices 10 are supported on frame 42. As it will be understood, the number of heating devices 10 and number of heating and cooling zones can be varied, as needed, to accommodate smaller or larger semiconductor substrates or to accommodate different temperature processes. In order to provide the proposed temperature profile, three heating zones 52, 62, and 72 are supported by sides 44, 46, 48, and 50 of frame 42 in a staggered, spaced apart arrangement. First heating zone 52 is supported on uppermost portions of sides 44, 46, 48, and 50. Second heating zone 62 is supported by intermediate portions of sides 44, 46, 48, and 50. Third heating zone 72 is supported by lower portions of sides 44, 46, 48, and 50. In this manner, first heating zone 52, which includes the greatest number of heating devices for heating the peripheral portions of substrate 61, is closest to substrate 61. The peripheral portion of substrate 61 typically cools faster and has lower heat absorption characteristics than the central portions of the substrate and, therefore, requires more heat. Second heating zone 62, which heats the intermediate portions of the substrate, is positioned at an intermediate distance from substrate 61. Third heating zone 72, which includes the fewest number of heating devices 10 for heating the central portion of the semiconductor substrate, is positioned at the furthest distance from the semiconductor substrate. As described above, the central portion of the substrate cools slower and has higher heat absorption characteristics than the other regions of substrate 61.

Sides 44, 46, 48, and 50 of frame 42 are preferably plates formed from insulating, non-conductive material, such as alumina, mica, or the like. Sides 44, 46, and 48, and 50 are held together with brackets 78 and anchored to a base 79 of a heating chamber 80 by brackets 82. Brackets 78 and 82 are preferably metal angle brackets that are secured to the respective sides of frame 42 and base 79 by conventional fasteners, such as bolts, screws, or the like. Sides 44 and 46 are of similar construction, with each side including a stepped free edge 84. Each free edge 84 includes a pair of upper edge portions 86, a pair of intermediate edge portions 88, and a lower central edge portion 90. Upper edge portions 84 of sides 48 and 50 support heating devices 10 on sides 58 and 60 of first zone 52. Intermediate edge portions 88 of sides 44 and 46 support heating devices 10 of sides 68 and 70 of second heating zone 62 below heating zone 52 so that first heating zone is positioned closer to substrate 61. Lower edge portions 90 of sides 44 and 46 support group 76 of heating devices 10 of heating zone 72 below second heating zone 62 so that the third heating zone is further away from substrate 61. Similarly, sides 48 and 50 each include a stepped free edge 94. Stepped free edge 94 is offset below free edge 84 of sides 44 and 46 to support the lower most heating devices 10 of the respective heating zones 52, 62, and 72. Each free edge 94 includes a pair of upper edge portions 96, a pair of intermediate edge portions 98, and a lower central edge portion 100, each offset from the corresponding free edges 86, 88, and 90 of sides 44 and 46 to accommodate the overlapping arrangements of heating devices 10 in each of the heating zones. Upper edge portions 96 of sides 48 and 50 support heating devices 10 on sides 54 and 56 of first heating zone 52. Intermediate edge portions 98 of sides 48 and 50 support heating devices 10 of sides 64 and 66 of second heating zone 62. Lower edge portions 100 of sides 48 and 50 support group 76 of heating devices 10 of heating zone 72. In this manner, sides 44, 46, 48, and 50 of heater assembly 40 allow individual heating devices 10 to be changed during routine maintenance and practically eliminate any possible obstruction of the heating devices' emitted energy from reaching the platform or semiconductor substrate 61.

Figure 3A:
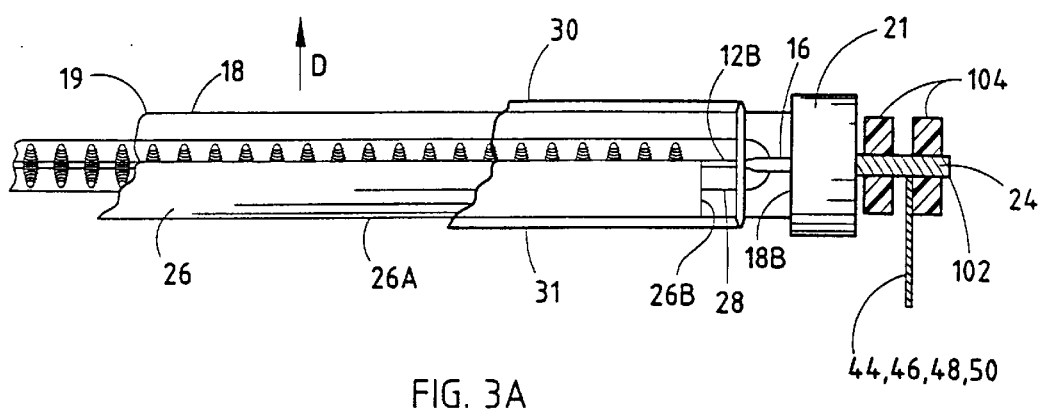
FIG. 3A is an enlarged front elevational view of the heating device supports.

Each edge portion 86, 88, 90, 96, 98, and 100 includes a plurality of heating device receiving surfaces 102, which provide vertical and lateral support for heating devices 10 thereon. As best seen in FIG. 3A, receiving surfaces 102 may comprise semi-circular recesses that hold electrodes 22 and 24 of the respective heating devices 10. Axial support is provided by a pair of insulating annular support members 104, which extend around electrodes 22 and 24 and are positioned on either side of the respective sides 44, 46, 48, and 50 of frame 42. In this manner, each heating device 10 is vertically and laterally supported on frame 42 by receiving surfaces 102 and axially restrained in frame 42 by support members 104. Insulating annular support members 104 preferably comprise alumina or mica material or other suitable insulating material.

When heater assembly 40 is placed in a heating chamber 80, such as a semiconductor heating chamber, and positioned beneath a platform (not shown) made from silicon carbide or silicon carbide coated graphite, the energy from heating devices 10 can be supplied with differing power densities—the power density varies as a function of the platform radius or the substrate radius. Regardless of whether heating zones 52, 62, and 72 include three or six control zones, each heating zone 52, 62, and 72 can be adjusted to ensure maximum temperature uniformity on the platform. When a semiconductor substrate is placed on this platform and when temperature sensors are used to detect the substrate surface temperature, which is part of a control loop of the heating zones, then the substrate/wafer temperature profile can be made uniform with great precision.

In the preferred embodiments described herein, heater device 10 and heater assembly 40 are described in relation to heating a semiconductor substrate. While heater device 10 and heater assembly 40 have particular usefulness in heating semiconductor material, their use is not so limited. It is to be understood that this is a description of the preferred embodiments and one skilled in the art will recognize that additional features, improvements and embodiments may be made without departing from the scope of the invention disclosed herein. The scope of the protection afforded is to be determined by the claims which follow and the breadth of the interpretation the law allows.

The embodiments of the invention in which I claim an exclusive property right or privilege are defined as follows:

1. A heating device comprising:
   an energy emitting filament adapted for electrically coupling to an external power supply, said energy emitting filament having cold end zones and a hot zone extending between said cold end zones;
   a first enclosure housing said heating element, said first enclosure being comprised of energy transmitting material;
   a second enclosure housing said first enclosure, said second enclosure being comprised of energy transmitting material;
   a reflective coating on an outer surface of said second enclosure and extending around at least a portion of said energy emitting filament and over at least said hot zone for reflecting the energy generated by said energy emitting filament when said energy emitting filament is energized by the external power supply; and
   a third enclosure housing said second enclosure, said third enclosure being comprised of energy transmitting material and encapsulating said reflective coating so that when said energy emitting filament is energized, particles comprising said reflective coating are contained in said heating device, said reflective coating reflecting the energy generated by said energy emitting filament through said third enclosure and directing said energy in an angle of focus.

2. A heating device according to claim 1, wherein said reflective coating comprises a gold coating.

3. A heating device according to claim 1, wherein said energy emitting filament comprises a tungsten wire filament.

4. A heating device according to claim 3, wherein said first enclosure is filled with a gas.

5. A heating device according to claim 1, wherein at least one of said first, second, and third enclosures comprises a material selected from the group consisting of quartz, silica and sapphire.

6. A heating device according to claim 1, wherein said second enclosure comprises a cylindrical tube having a pair of open ends and a cylindrical wall extending therebetween, said first enclosure supported in said cylindrical tube between said open ends.

7. A heating device according to claim 6, further comprising end caps, said end caps being welded to said cylindrical tube thereby sealing said open ends.

8. A heating device according to claim 7, wherein each of said end caps includes an electrode coupling to said energy emitting filament, said electrodes for electrically coupling said energy emitting filament to the external power supply.

9. A heating device according to claim 6, wherein said reflective coating includes a circumferential extent, said circumferential extent extending around said cylindrical tube through at least one hundred and eighty degrees.

10. A heating device for heating a target, said heating device comprising:
    a first cylindrical tubular member having closed ends and a cylindrical wall extending between said closed ends, said first tubular member being comprised of energy transmitting material;
    an energy emitting filament supported in said first cylindrical tubular member and extending between said closed ends, said energy emitting filament adapted for coupling to an external power source, said energy emitting filament including cold zones and a hot zone extending between said cold zones;
    a second cylindrical tubular member housing and enclosing said first cylindrical tubular member, said second cylindrical tubular member having a cylindrical wall and being comprised of energy transmitting material, and an outer surface of said cylindrical wall including a reflective layer extending around at least a portion of said energy emitting filament and over at least said hot zone for reflecting energy generated by said energy emitting filament outwardly from said second cylindrical tubular member; and a third cylindrical tubular member enclosing said second cylindrical tubular member, said third cylindrical tubular member being comprised of energy transmitting material and extending over said reflective layer, said third cylindrical tubular member being welded to said second cylindrical wall and encapsulating said reflective layer so that when said energy emitting filament is energized, particles comprising said reflective layer are contained in said heating device.

11. A heating device for heating a target, said heating device comprising:

a first cylindrical tubular member having closed ends and a cylindrical wall extending between said closed ends said first tubular member being comprised of energy transmitting material;

an energy emitting filament supported in said first cylindrical tubular member and extending between said closed ends, said energy emitting filament adapted for coupling to an external power source, said energy emitting filament including cold zones adjacent both ends of said energy emitting filament and a hot zone extending between said cold zones:

a second cylindrical tubular member housing and enclosing said first cylindrical tubular member, said second cylindrical tubular member having a cylindrical wall and being comprised of energy transmitting material and an outer surface of said cylindrical wall including a reflective layer extending around at least a portion of said energy emitting filament and over said hot zone and not extending substantially over said cold zones for reflecting energy generated by said energy emitting filament outwardly from said second cylindrical tubular member; and a third cylindrical tubular member enclosing said second cylindrical tubular member, said third cylindrical tubular member being comprised of energy transmitting material and extending over said reflective layer, said third cylindrical tubular member being welded to said second cylindrical wall and encapsulating said reflective layer so that when said energy emitting filament is energized, particles comprising said reflective layer are contained in said heating device.

12. A heating device according to claim 10, wherein said reflective layer comprises a gold coating.

13. A heating device according to claim 10, wherein said reflective layer extends around said second cylindrical tubular member in a range between about two hundred and forty degrees to three hundred and thirty degrees thereby forming a window through which the energy generated from said energy emitting filament is projected toward the target in an angle of focus in the range of about one hundred and twenty degrees to thirty degrees, respectively.

14. A heating device according to claim 10, said second cylindrical tubular member including non-conductive end caps, said end caps being welded to said second cylindrical wall and sealing said open ends.

15. A heating device according to claim 14, said end caps including electrodes for coupling to an external power supply, said electrodes coupled to said energy emitting filament for coupling said energy emitting filament to the external power supply.

16. A heating device according to claim 14, wherein said end caps comprise alumina end caps.

17. A heating device according to claim 10, wherein at least one of said cylindrical tubular members comprises a material selected from the group consisting of quartz, sapphire, and silica.

18. A heating assembly for heating a semiconductor substrate supported on a first side of the substrate, said heating assembly comprising:

a plurality of heater supports; and a plurality of cylindrical heating lamps supported on said heater supports, each of said cylindrical heating lamps having a longitudinal extent, said longitudinal extents of said first group of heating lamps being generally parallel with a second opposed side of the semiconductor substrate and being positioned at a first spacing from the second opposed side of the semiconductor substrate and aligned over a perimeter region of the substrate to heat the perimeter region of the semiconductor substrate, said first group of heating lamps defining a first heating zone, a second group of cylindrical heating lamps positioned by said heater supports at a second spacing from the second opposed side of the semiconductor substrate and positioned to extend across the substrate to heat a central region of the semiconductor substrate, said second group defining a second heating zone, and wherein said first spacing is less than said second spacing to create a varying temperature profile which is applied to the second side of the substrate.

19. A heating assembly according to claim 18, wherein said heating lamps comprise infrared heating lamps.

20. A heating assembly according to claim 18, wherein each of said heating lamps comprises:

an energy emitting filament adapted for electrically coupling to an external power supply;

a first enclosure housing said energy emitting filament, said first enclosure being comprised of energy transmitting material;

a second enclosure housing said first enclosure, said second enclosure being comprised of energy transmitting material;

a reflective coating on an outer surface of said second enclosure for reflecting the energy generated by the filament when the filament is energized by the external power supply; and a third enclosure housing said second enclosure, said third enclosure being comprised of energy transmitting material and encapsulating said reflective coating so that when said energy emitting filament is energized, particles comprising said reflective coating are contained in said heating lamp.

21. A heating assembly according to claim 18, further comprising a third group of said heating lamps positioned by said heating supports a third spacing from the second side of the semiconductor substrate to heat an intermediate region of the semiconductor substrate, said third group defining a third heating zone.

22. A heating assembly according to claim 21, wherein said first group of heating elements includes a larger number of heating elements than either of said second and third groups of heating elements so that a greater amount of heat is directed to the radial regions of the semiconductor substrate than the other regions of the semiconductor substrate.

23. A heating assembly according to claim 21, wherein said first group of heating lamps are supported in a square-shaped frame assembly and include overlapping end portions.

24. A heating assembly according to claim 23, wherein said overlapping end portions comprise cold zones of said heating lamps.

25. A heating assembly according to claim 23, wherein said third group of heating lamps are supported in a lattice-shaped configuration and include overlapping portions.

26. A heating assembly according to claim 25, wherein said second group of heating lamps are supported in a cross-shaped configuration, said second group of heating lamps having overlapping portions, said third and second group of heating lamps each having cold end zones extending under said first group of heating lamps.

27. A heating assembly according to claim 18, wherein said supports comprise plates, said plates being arranged to form a frame.

28. A heating assembly according to claim 27, wherein said plates comprise nonconductive material.

29. A heating assembly according to claim 28, wherein said non-conductive material comprises alumina.

30. A method of heating a semiconductor substrate, said method comprising the steps of:
supporting a first group of heating lamps in a first arrangement to form a first heating zone, each of the heating lamps of the first group having a heating element aligned along a longitudinal extent;
positioning the longitudinal extents of the first group of heating lamps generally parallel with a first side of a semiconductor substrate and aligning the first group of heating lamps over a peripheral region of the substrate to heat the peripheral region of the semiconductor substrate;
supporting a second group of heating lamps in a second arrangement to form a second heating zone, each of the heating lamps of the second group having a heating element aligned along a longitudinal extent;
positioning the longitudinal extents of the second group of heating lamps generally parallel with the first side of the semiconductor substrate and aligning the second group of heating lamps over at least a central region of the substrate to heat the central region of the semiconductor substrate;
spacing the first group of heating lamps a first distance from the first side of the semiconductor substrate;
spacing the second group of heating lamps a second distance from the first side of the semiconductor substrate, the first distance being less than the second distance; and
applying heat to said semiconductor substrate with said first group of said heating lamps and said second group of heating lamps whereby more heat is directed to the peripheral regions than the central regions of the semiconductor substrate.

31. A method of heating according to claim 30, further comprising the steps of:
supporting a third group of heating lamps in a third arrangement to form a third heating zone disposed to heat an intermediate region of the semiconductor substrate; and
positioning the third group of heating lamps a third distance from the semiconductor substrate, the third distance being less than the second distance and greater than the first distance, said step of applying heat including applying heat with said third set of heating lamps whereby more heat is directed to the peripheral regions than the intermediate regions of the semiconductor substrate and more heat is directed to the intermediate regions than the central regions of the semiconductor substrate.

32. A method of heating according to claim 31, wherein said step of supporting the first group includes the steps of:
arranging the first group in a generally square shaped frame for directing the heat from said heating lamps to the peripheral regions of the semiconductor substrate; and
overlapping cold end zones of the heating lamps to form the generally square shaped frame whereby heat emitting surfaces of the heating lamps are unobstructed to maximize the heat emitted from the heating lamps.

33. A method of heating according to claim 32, wherein said step of supporting the third group includes the step of:
arranging the third group in a generally lattice shaped arrangement for directing the heat from said heating lamps to the intermediate regions of the semiconductor substrate; and
overlapping medial portions of the first group with cold end zones of the third group so that the heat emitting surfaces of said heating lamps in said third group are unobstructed by the heating lamps of said first group.

34. A method of heating a semiconductor substrate, said method of heating comprising:
providing a plurality of heating elements, each of the heating elements comprising:
an energy emitting filament adapted for electrically coupling to an external power supply, said energy emitting filament including cold end zones and a hot zone extending between said cold end zones;
a first enclosure housing said heating element, said first enclosure being comprised of energy transmitting material;
a second enclosure housing said first enclosure, said second enclosure being comprised of energy transmitting material;
a reflective coating on an outer surface of said second enclosure for reflecting the energy generated by the filament outwardly from the heating element when the filament is energized by the external power supply said reflective coating extending around at least a portion of said energy emitting filament and over at least said hot zone; and
a third enclosure housing said second enclosure, said third enclosure being comprised of energy transmitting material and encapsulating said reflective coating so that when said energy emitting filament is energized, particles comprising said reflective coating are contained in said heating device;
arranging a first group of said heating elements over a peripheral region of the semiconductor substrate;
arranging a second group of the heating elements over a central region of the semiconductor substrate, and applying a varying heat temperature profile to the semiconductor substrate with the heating elements to achieve a uniform substrate temperature.

35. A method of heating according to claim 34, further comprising the step of:
arranging the plurality of heating elements into at least two heating zones;
directing the heat emitted from the heating elements in one of the heating zones toward a peripheral region of the semiconductor substrate; and
directing the heat emitting from the heating elements in the other heating zone toward a central region of the semiconductor substrate.

36. A method of heating a semiconductor substrate, said method of heating comprising:
  providing a plurality of heating elements, each of the heating elements comprising:
    an energy emitting filament adapted for electrically coupling to an external power supply;
    a first enclosure housing said energy emitting filament, said first enclosure being comprised of energy transmitting material;
    a second enclosure housing said first enclosure said second enclosure being comprised of energy transmitting material;
    a reflective coating on an outer surface of said second enclosure for reflecting the energy generated by the filament outwardly from the heating element when the filament is energized by the external power supply; and
    a third enclosure housing said second enclosure, said third enclosure being comprised of energy transmitting material and encapsulating said reflective coating so that when said energy emitting filament is energized, particles comprising said reflective coating are contained in said heating device;
  positioning said heating elements proximate the semiconductor substrate;
  arranging the plurality of heating elements into at least two heating zones;
  directing the heat emitted from the heating elements in one of the heating zones toward a peripheral region of the semiconductor substrate;
  directing the heat emitting from the heating elements in the other heating zone toward a central region of the semiconductor substrate wherein arranging includes spacing one heating zone a first distance from the semiconductor substrate and spacing the other heating zone a second distance from the semiconductor substrate, wherein the first distance is greater than the second distance such that more heat is directed to the peripheral regions than the central regions of the semiconductor substrate; and
  applying heat to the semiconductor substrate with the heating elements.

37. A heating device according to claim 1, wherein said reflective coating reflects energy generated by said energy emitting filament outwardly from said second cylindrical tubular member, said third enclosure including a third enclosure outer surface, at least a portion of said third enclosure outer surface defining a heat emitting surface for permitting heat from said energy emitting filament to be directed outwardly from said heating device.

38. A heating device according to claim 1, wherein said first enclosure defines a inner most chamber, said energy emitting filament being supported in said inner most chamber and directing heat outwardly from said heating device for heating a target spaced from said heating device.

39. A heating device according to claim 1, wherein said energy emitting filament, said first enclosure, said second enclosure, and said third enclosure are co-axial.

40. A heating device according to claim 9, wherein said circumferential extent of said reflective coating terminates to define an uncoated side of said second enclosure to thereby form a window through which energy from said energy emitting filament is emitted and projected at an angle of focus for directing heat toward a target spaced from said heating device.

41. A heating device according to claim 40, wherein said angle of focus is in a range of 30° to 120°.

42. A heating device according to claim 41, wherein said angle of focus is about 90°.

43. A heating device according to claim 10, wherein said first cylindrical tubular member, said energy emitting filament, said second cylindrical tubular member, and said third cylindrical tubular member are co-axial.

44. A heating device according to claim 10, wherein at least a portion of said outer surface of said second cylindrical tubular member includes a heat emitting surface through which energy from said energy emitting filament is emitted and projected for heating a target spaced from said heating device.

45. A heating device according to claim 10, wherein said reflective layer includes a circumferential extent which extends around a portion of said outer surface of said second cylindrical tubular member, said circumferential extent of said reflective layer terminating to define an uncoated side of said second tubular member through which energy from said energy emitting filament is emitted and projected for heating a target spaced from said heating device.

46. A heating assembly for heating a semiconductor substrate, the semiconductor substrate having a first side and being supported on the first side, said heater assembly comprising:
  a support; and
  a plurality of heating devices supported on said support, each of said heating devices having a longitudinal extent, said longitudinal extents of a first group of said heating devices being arranged generally parallel with a second opposed side of the semiconductor substrate for heating the second opposed side of the semiconductor substrate and being positioned at a first spacing from the second opposed side of the semiconductor substrate and aligned over a peripheral portion of the substrate to heat the peripheral portion of the semiconductor substrate, said first group of heating devices defining a first heating zone, a second group of said heating devices being positioned by said support at a second spacing from the second opposed side of the semiconductor substrate and being positioned to extend across the substrate to heat a central portion of the semiconductor substrate, said second group of heating devices defining a second heating zone, and said first and second heating zones creating a varying temperature profile which is applied to the second side of the substrate to achieve a uniforn substrate temperature.

47. A heating assembly according to claim 46, wherein said heating devices comprise heating lamps.

48. A heating assembly according to claim 46, wherein said first spacing is less than said second spacing.

49. A heating assembly according to claim 46, wherein said heating devices comprise cylindrical heating lamps.

50. A heating assembly according to claim 46, wherein said heating devices each include heat emitting surfaces, said emitting surfaces having an angle of focus in a range of about 30 degrees to 120 degrees for focusing the heat emitted from said heating devices toward the semiconductor substrate.

51. A heating assembly according to claim 1, wherein said angle of focus is in a range of about 30 degrees to about 120 degrees.

52. A heating assembly according to claim 1, wherein said second enclosure comprises a cylindrical tube, said cylindrical tube including a pair of opposed ends and a cylindrical wall extending between said opposed ends, said reflective coating extending over at least a portion of said cylindrical wall and having terminal ends, said third enclosure extending over said reflective coating and being welded to said cylindrical wall of said cylindrical tube between said opposed ends and said terminal ends of said reflective coating to thereby encapsulate said reflective coating.

* * * * *

UNITED STATES PATENT AND TRADEMARK OFFICE
CERTIFICATE OF CORRECTION

PATENT NO.   : 5,951,896
DATED        : September 14, 1999
INVENTOR(S)  : Imad Mahawili It is certified that error appears in the above-identified patent and that said Letters Patent is hereby corrected as shown below:

Column 4,
Line 26, "accomodate" should be -- accommodate --

Column 5,
Lines 5 and 6, "preferred-heater" should be -- preferred heater --

Column 11,
Line 16, insert -- , -- after "ends"
Line 29, insert -- , -- after "material"

Column 13,
Line 17, "nonconductive" should be -- non-conductive --

Column 14,
Line 41, insert -- , -- after "supply"
Line 53, "substrate," should be -- substrate; --

Column 15,
Line 10, insert -- , -- after the second occurrence of "enclosure"

Column 16,
Line 48, "uniforn" should be -- uniform --

Signed and Sealed this

Twenty-seventh Day of November, 2001

*Attest:*

*Attesting Officer*

NICHOLAS P. GODICI
*Acting Director of the United States Patent and Trademark Office*